(12) United States Patent
Krause

(10) Patent No.: US 8,280,659 B2
(45) Date of Patent: Oct. 2, 2012

(54) EARLY DETECTION OF MINIMUM CELL VOLTAGE DEGRADATION OF A FUEL CELL STACK

(75) Inventor: Bernd Krause, Liederbach (DE)

(73) Assignee: GM Global Technology Operations LLC, Detroit, MI (US)

( * ) Notice: Subject to any disclaimer, the term of this patent is extended or adjusted under 35 U.S.C. 154(b) by 331 days.

(21) Appl. No.: 12/691,511

(22) Filed: Jan. 21, 2010

(65) Prior Publication Data

US 2011/0178743 A1 Jul. 21, 2011

(51) Int. Cl.
*G01R 31/36* (2006.01)
*H02J 7/00* (2006.01)
(52) U.S. Cl. .......................... 702/63; 320/134
(58) Field of Classification Search .............. 702/63, 702/64; 429/13, 23, 24; 320/134, 136
See application file for complete search history.

(56) References Cited

U.S. PATENT DOCUMENTS

2008/0145715 A1* 6/2008 Lienkamp et al. ............. 429/13
2009/0325006 A1* 12/2009 Yagi et al. ..................... 429/13

* cited by examiner

*Primary Examiner* — Bryan Bui
(74) *Attorney, Agent, or Firm* — John A. Miller; Miller IP Group, PLC

(57) ABSTRACT

A method for determining a low performing cell in a fuel cell stack. The method measures the voltage of each cell in the fuel cell stack and calculates an average cell voltage of all of the cell voltages from the fuel cell stack at a plurality of stack current densities. The method also identifies a minimum cell voltage from all of the cell voltages from the fuel cell stack at the plurality of stack current densities that the average cell voltages are calculated and determines a relative delta voltage relationship between the average cell voltage and the minimum cell voltage at each of the plurality of stack current densities. The relative delta voltage relationships are used to determine whether the minimum cell voltage indicates a persistent stack problem.

18 Claims, 2 Drawing Sheets

EARLY DETECTION OF MINIMUM CELL VOLTAGE DEGRADATION OF A FUEL CELL STACK

BACKGROUND OF THE INVENTION

1. Field of the Invention

This invention relates generally to a method for detecting minimum cell voltage degradation in a fuel cell stack and, more particularly, to a method for detecting minimum cell voltage degradation in a fuel cell stack that calculates a relative average voltage between an average cell voltage and a minimum cell voltage over a range of stack current densities.

2. Discussion of the Related Art

Hydrogen is a very attractive fuel because it is clean and can be used to efficiently produce electricity in a fuel cell. A hydrogen fuel cell is an electro-chemical device that includes an anode and a cathode with an electrolyte therebetween. The anode receives hydrogen gas and the cathode receives oxygen or air. The hydrogen gas is dissociated in the anode to generate free protons and electrons. The protons pass through the electrolyte to the cathode. The protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation.

Several fuel cells are typically combined in a fuel cell stack by serial coupling to generate the desired power. For example, a typical fuel cell stack for a vehicle may have two hundred or more stacked fuel cells. The fuel cell stack receives a cathode input reactant gas, typically a flow of air forced through the stack by a compressor. Not all of the oxygen is consumed by the stack and some of the air is output as a cathode exhaust gas that may include water as a stack by-product. The fuel cell stack also receives an anode hydrogen reactant gas that flows into the anode side of the stack. The stack also includes flow channels through which a cooling fluid flows.

The fuel cell stack includes a series of bipolar plates positioned between the several MEAs in the stack, where the bipolar plates and the MEAs are positioned between the two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

As a fuel cell stack ages, the performance of the individual cells in the stack degrade differently as a result of various factors. There are different causes of low performing cells, such as cell flooding, loss of catalyst, etc., some temporary and some permanent, some requiring maintenance, and some requiring stack replacement to exchange those low performing cells. Although the fuel cells are electrically coupled in series, the voltage of each cell when a load is coupled across the stack decreases differently where those cells that are low performing have lower voltages. Thus, it is necessary to monitor the cell voltages of the fuel cells in the stack to ensure that the voltages of the cells do not drop below a predetermined threshold voltage to prevent cell voltage polarity reversal, possibly causing permanent damage to the cell.

Monitoring the voltage of the fuel cells to ensure that the voltage of the minimum performing cell does not fall below a predetermined threshold requires that the current draw from the cell does not exceed a predetermined limit. Different techniques are known in the art for monitoring the cell voltage and improvements can be made.

SUMMARY OF THE INVENTION

In accordance with the teachings of the present invention, a method for determining a low performing cell in a fuel cell stack is disclosed. The method measures the voltage of each cell in the fuel cell stack and calculates an average cell voltage of all of the cell voltages from the fuel cell stack at a plurality of stack current densities. The method also identifies a minimum cell voltage from all of the cell voltages from the fuel cell stack at the plurality of stack current densities that the average cell voltages are calculated and determines a relative delta voltage relationship between the average cell voltage and the minimum cell voltage at each of the plurality of stack current densities. The relative delta voltage relationships are used to determine whether the minimum cell voltage indicates a persistent stack problem.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for identifying a low performing cell in a fuel cell stack by calculating a relative delta voltage between an average cell voltage and a minimum cell voltage is merely exemplary in nature, and is in no way intended to limit the invention or its applications or uses.

Figure 1:
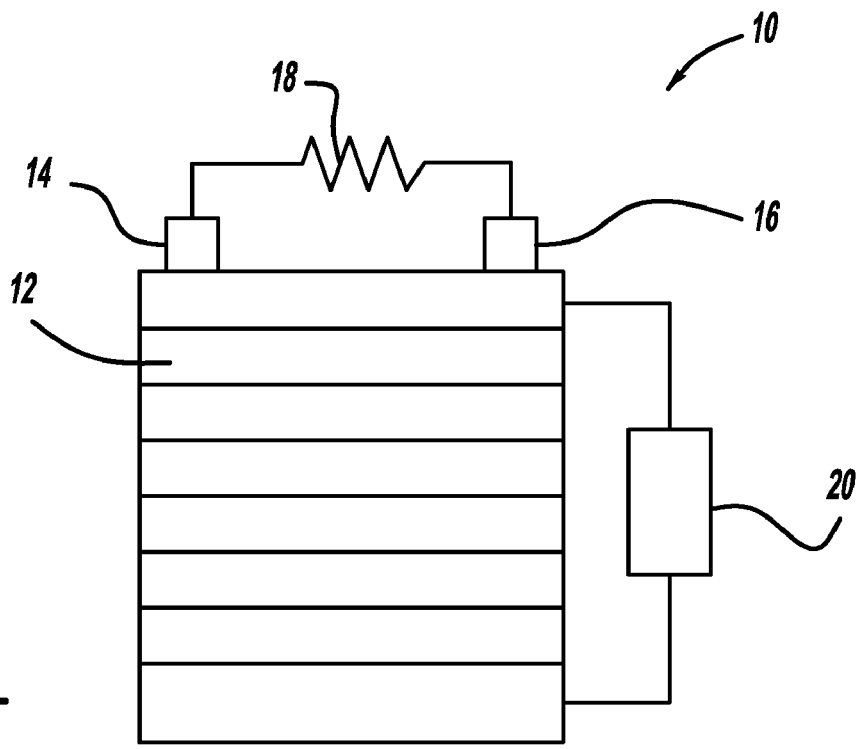
FIG. 1 is a simplified block diagram of a fuel cell stack.

FIG. 1 is a plan view of a fuel cell stack 10 including a plurality of fuel cells 12 electrically coupled in series. The fuel cell stack 10 also includes a positive terminal 14 and a negative terminal 16 that are electrically coupled to the fuel cells 12. A system load 18 is electrically coupled to the terminals 14 and 16. A voltage monitoring circuit 20 is electrically coupled to the fuel cells 12 and monitors the voltage of each of the fuel cells 12. As will be discussed in detail below, the fuel cell monitoring circuit 20 monitors the voltage of the fuel cells 12 to determine the average cell voltage and to identify the minimum performing cell.

Figure 2:
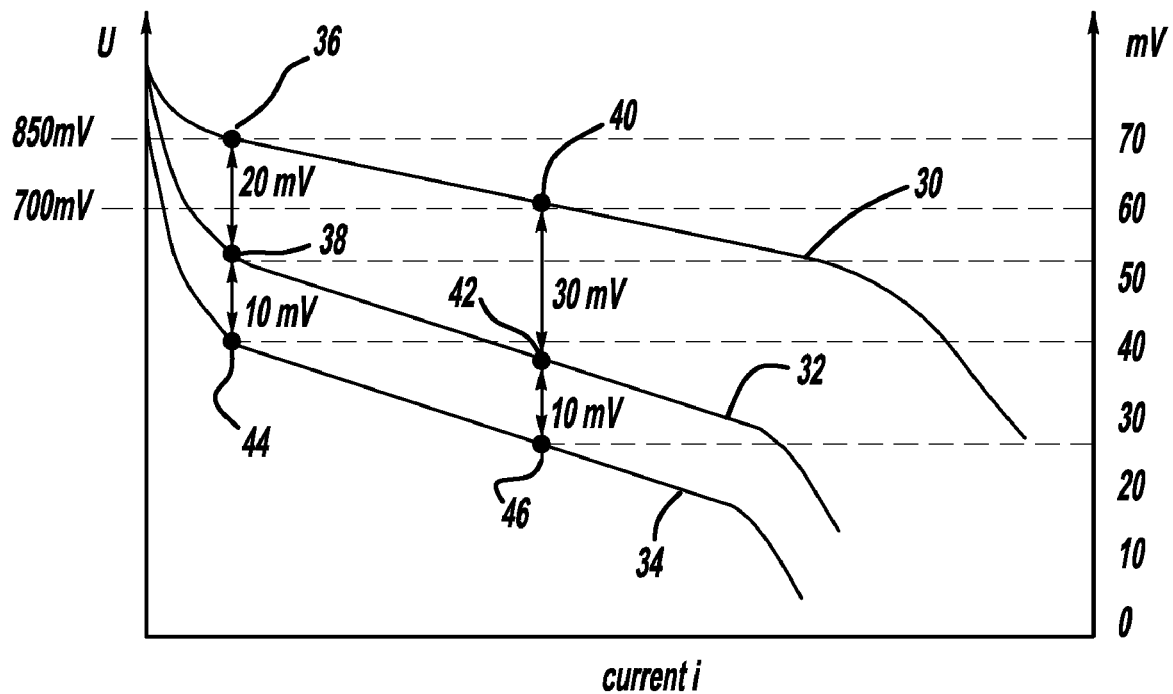
FIG. 2 is a graph with current on the horizontal axis and voltage on the vertical axis showing polarization curves for an average cell voltage and a minimum cell voltage.

FIG. 2 is a graph with stack current on the horizontal axis and stack voltage on the vertical axis showing typical polarization curves for the fuel cell stack 10. The graph shows a polarization curve 30 for the average voltage of the fuel cells 12 over the stack current density range of operation, a polarization curve 32 for the cell with the minimum voltage after 1 hour of stack life operation over the stack current density range of operation and a polarization curve 34 for the cell with the minimum voltage after a significant portion of the stack life has occurred over the stack current density range of operation. As is apparent, the center portion of the polarization curves 30, 32 and 34 is relatively linear, also known as ohmic polarization region. However, the slope of the linear portion is different for the average cell voltage and the minimum cell voltage. Particularly, the difference between the voltages of the polarization curves 30 and 32 for low current densities is about 20 mV and the difference between the voltages of the polarization curves 30 and 32 for higher current densities is about 30 mV, thus giving the minimum cell voltages a higher negative slope.

According to the invention, a relative delta voltage value rel. delta U is calculated using the average cell voltages and the minimum cell voltages at several sample locations along the polarization curves. The relative delta voltage value rel. delta U can then be compared to a predetermined threshold to determine whether the minimum cell voltage is too low. The relative delta voltage value rel. delta U is calculated as:

$$\text{rel.delta } U = (U_{avg} - U_{min}) \cdot U_{avg}/1000$$

Where $U_{avg}$ is the average voltage of the fuel cells 12, $U_{min}$ is the minimum voltage of the fuel cells 12 and 1000 is a scaling factor that is not essential for the calculation but is used to get integers and prevent decimals to simplify the visualization and the usage of the rel. delta U values.

The present invention calculates the relative delta voltage value rel. delta U for a plurality of sample points between the average cell voltage and the minimum cell voltage during the life of the stack 10 to monitor the minimum cell voltage and determine when the minimum cell voltage may affect stack performance. Because every voltage difference between the average cell voltage and the minimum cell voltage is multiplied with, i.e., related to, the average cell voltage, it is independent of the current stack power level and has a higher impact the higher the voltage is. Thus, there is a difference at low current/high voltages than at high current/low voltages. Therefore, even low voltage differences between the average cell voltage and the minimum cell voltage can have a high impact due to weighting with the average cell voltage.

This weighting is done because the minimal voltage usually has a higher ohmic loss, i.e., a higher negative slope in the center portion of the polarization curve, than the average cell voltage so that the voltage difference becomes higher the lower the voltage is, and hence, the higher the current density. So, the relation is shifting the severity of a voltage difference towards lower current densities. Due to the independence from the current density, there is no need for a well controlled fuel cell stack test platform that keeps the current density constant so that the present invention allows detection of a permanent single cell voltage degradation even in dynamic operated systems, such as fleet vehicles. By definition of a maximum allowed rel. delta U and specific alarm thresholds, one can use the present invention for an early detection of minimum cell voltage degradation.

The above discussion can be shown by the values in FIG. 2. It should be noted that the values shown in FIG. 2 are not real world data, but are artificial values to illustrate the principal idea of the rel. delta U. For the polarization curves 30 and 32, calculating the relative delta voltage value rel. delta U between points 36 and 38 gives 20·850/1000=17 and calculating the relative delta voltage value rel. delta U between points 40 and 42 gives 30·700/1000=21. For the polarization curves 30 and 34, the relative delta voltage value rel. delta U between points 36 and 44 is 30·850/1000=25.5, which provides a difference between 17 and 25.5 of 8.5. The relative delta voltage value rel. delta U between points 40 and 46 is 40·700/1000=28, which provides a difference between the lines 32 and 34 of 7. This example shows that a performance loss of 10 mV over time of the minimum cell voltage over the whole current density range results in a higher increase of rel. delta U at higher voltages compared to the increase at lower voltages. Thus, the severity of a voltage difference is shifted towards lower current densities due to the relation to the average cell voltage.

Figure 3:
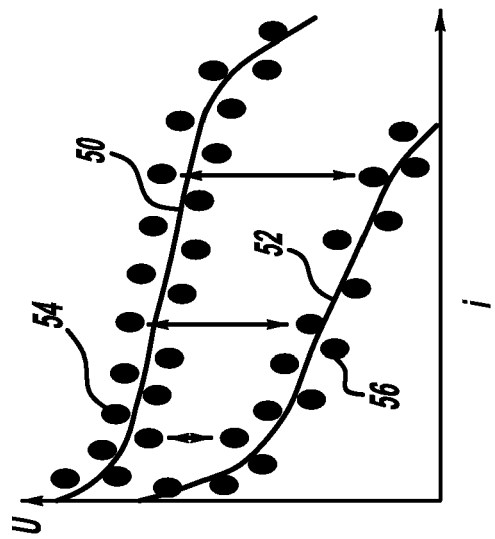
FIG. 3 is a graph with current on the horizontal axis and voltage on the vertical axis showing raw data points for a sample period for a stack polarization curve.

FIG. 3 is a graph with current on the horizontal axis and voltage on the vertical axis showing example data points 54 that could have been used to calculate the polarization curve 50 for the average cell voltage and example data points 56 that could have been used to calculate the polarization curve 52 for the minimum cell voltage. The data points 54 and 56 are data for one raw data file over a predetermined time period. It is clear from the data points 54 and 56 that the slope of the polarization curves 50 and 52 are not the same. Thus, as discussed above, the relative delta voltage values rel. delta U at lower stack current densities will be lower than the relative delta voltage values rel. delta U at higher stack current densities.

Figure 4:
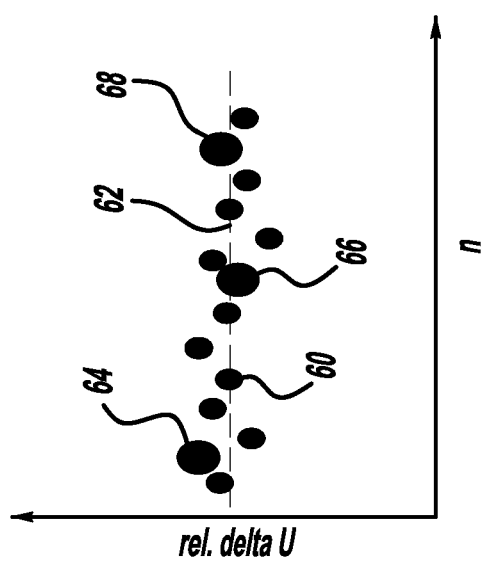
FIG. 4 is a graph with a number of data points on the horizontal axis and relative delta voltage on the vertical axis showing an average voltage for the raw sample points shown in FIG. 3.

FIG. 4 is a graph with a raw data file sample number n on the horizontal axis and rel. delta U on the vertical axis showing data points 60 for all of the relative delta voltage value rel. delta U calculated from the sample points 54 and 56 in FIG. 3. Line 62 represents the average of the relative delta voltage values rel. delta U for the data points 60 where the data points 60 are collected within one raw data file or within a certain and frequent time frame. An averaging reduces the number of data points without decreasing the information about the minimum cell voltage performance. Point 64 represents the relative delta voltage value rel. delta U for the low stack current density line between the curves 50 and 52 in FIG. 3, point 66 represents the relative delta voltage value rel. delta U for the high stack current density line between the polarization curves 50 and 52 in FIG. 3 and point 68 represents the relative delta voltage value rel. delta U for the medium stack current density line between the polarization curves 50 and 52 in FIG. 3.

Figure 5:
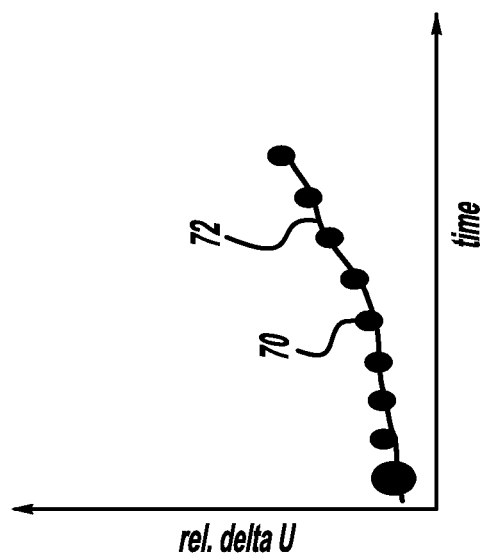
FIG. 5 is a graph with time on the horizontal axis and relative delta voltage on the vertical axis showing the relative delta voltage for several sample periods to identify a low performing cell trend.

FIG. 5 is a graph with time on the horizontal axis and the average relative delta voltage value rel. delta U for each separate raw data file where each sample point 70 is an average taken from the relative delta voltage values rel. delta U from FIG. 4. Therefore, for each group of data points available from each data file, a point is placed in the graph on FIG. 5 and a trend line 72 is observed. Thus, the trend of the low performing cell over time can be watched and a calculation can be made as to when that cell may require attention. The trend line 72 is represented by a polynomial $5^{th}$ grade mathematical relationship.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for identifying a low performing cell in a fuel cell stack, said method comprising:
    using a voltage monitoring circuit for:
    measuring the voltage of each cell in the fuel cell stack;
    calculating an average cell voltage of all of the cell voltages in the fuel cell stack;
    identifying a minimum cell voltage from all of the cell voltages in the fuel cell stack;
    determining a relative delta voltage relationship between the average cell voltage and the minimum cell voltage; and
    using the relative delta voltage relationship to determine whether a maximum allowed relative delta voltage has been reached such that the minimum cell voltage indicates a stack problem.

2. The method according to claim 1 wherein the relative delta voltage relationship is determined by:

$$\text{rel.}\delta U = (U_{avg} - U_{min}) \cdot U_{avg}/1000$$

where rel. $\delta U$ is a relative delta voltage value, $U_{avg}$ is the average cell voltage, $U_{min}$ is the minimum cell voltage and 1000 is a scaling factor.

3. The method according to claim 1 further comprising providing the average cell voltage and the minimum cell voltage as polarization curves of stack current density and voltage.

4. The method according to claim 1 wherein calculating an average cell voltage of all of the cell voltages includes calculating an average cell voltage of all of the cell voltages at a plurality of stack current densities.

5. The method according to claim 4 wherein identifying a minimum cell voltage of all of the cell voltages includes identifying a minimum cell voltage of all of the cell voltages at the plurality of stack current densities that the average cell voltages are calculated.

6. The method according to claim 5 wherein determining a relative delta voltage relationship between the average cell voltage and the minimum cell voltage includes determining a relative delta voltage relationship between the average cell voltage and the minimum cell voltage at each of the plurality of stack current densities.

7. The method according to claim 6 wherein determining a relative delta voltage relationship between the average cell voltage and the minimum cell voltage includes determining a relative delta voltage relationship between the average cell voltage and the minimum cell voltage at the plurality of stack current densities as a single data point and wherein the method determines a relative delta voltage relationship between the average cell voltage and the minimum cell voltage at the plurality of stack current densities for a plurality of data points to determine a minimum cell voltage trend.

8. A method for identifying a low performing cell in a fuel cell stack, said method comprising:
    using a voltage monitoring circuit for:
    measuring the voltage of each cell in the fuel cell stack;
    calculating an average cell voltage of all of the cell voltages in the fuel cell stack at a plurality of stack current densities;
    identifying a minimum cell voltage from all of the cell voltages in the fuel cell stack at the plurality of stack current densities that the average cell voltages are calculated;
    determining a relative delta voltage relationship between the average cell voltage and the minimum cell voltage at each of the plurality of stack current densities; and
    using the relative delta voltage relationships to determine whether a maximum allowed delta voltage has been reached such that the minimum cell voltage indicates a stack problem.

9. The method according to claim 8 wherein the relative delta voltage relationship is determined by:

$$\text{rel.}\delta U = (U_{avg} - U_{min}) \cdot U_{avg}/1000$$

where rel. $\delta U$ is a relative delta voltage value, $U_{avg}$ is the average cell voltage, $U_{min}$ is the minimum cell voltage and 1000 is a scaling factor.

10. The method according to claim 8 further comprising providing the average cell voltage and the minimum cell voltage as polarization curves of stack current density and voltage.

11. The method according to claim 8 wherein determining a relative delta voltage relationship between the average cell voltage and the minimum cell voltage includes determining a relative delta voltage relationship between the average cell voltage and the minimum cell voltage at the plurality of stack current densities as a single data point and wherein the method determines a relative delta voltage relationship between the average cell voltage and the minimum cell voltage at the plurality of stack current densities for a plurality of data points to determine a minimum cell voltage trend.

12. A system for identifying a low performing cell in a fuel cell stack, said system comprising:
    means for measuring the voltage of each cell in the fuel cell stack;
    means for calculating an average cell voltage of all of the cell voltages in the fuel cell stack;
    means for identifying a minimum cell voltage from all of the cell voltages in the fuel cell stack;
    means for determining a relative delta voltage relationship between the average cell voltage and the minimum cell voltage; and
    means for using the relative delta voltage relationship to determine whether a maximum allowed relative delta voltage has been reached such that the minimum cell voltage indicates a stack problem.

13. The system according to claim 12 wherein the relative delta voltage relationship is determined by:

$$\text{rel.}\delta U = (U_{avg} - U_{min}) \cdot U_{avg}/1000$$

where rel. $\delta U$ is a relative delta voltage value, $U_{avg}$ is the average cell voltage, $U_{min}$ is the minimum cell voltage and 1000 is a scaling factor.

14. The system according to claim 12 further comprising means for providing the average cell voltage and the minimum cell voltage as polarization curves of stack current density and voltage.

15. The system according to claim 12 wherein the means for calculating an average cell voltage of all of the cell voltages calculates an average cell voltage of all of the cell voltages at a plurality of stack current densities.

16. The system according to claim 15 wherein the means for identifying a minimum cell voltage of all of the cell voltages identifies a minimum cell voltage of all of the cell voltages at the plurality of stack current densities that the average cell voltages are calculated.

17. The system according to claim 16 wherein the means for determining a relative delta voltage relationship between the average cell voltage and the minimum cell voltage determines a relative delta voltage relationship between the average cell voltage and the minimum cell voltage at each of the plurality of stack current densities.

18. The system according to claim 17 wherein the means for determining a relative delta voltage relationship between the average cell voltage and the minimum cell voltage determines a relative delta voltage relationship between the average cell voltage and the minimum cell voltage at the plurality of stack current densities as a single data point and determines a relative delta voltage relationship between the average cell voltage and the minimum cell voltage for a plurality of data points to determine a minimum cell voltage trend.

* * * * *